United States Patent
Spiegelman et al.

(10) Patent No.: US 6,514,313 B1
(45) Date of Patent: Feb. 4, 2003

(54) GAS PURIFICATION SYSTEM AND METHOD

(75) Inventors: Jeffrey J. Spiegelman, La Jolla, CA (US); Russell L. Abber, Newport Coast, CA (US)

(73) Assignee: Aeronex, Inc., San Diego, CA (US)

(*) Notice: Subject to any disclaimer, the term of this patent is extended or adjusted under 35 U.S.C. 154(b) by 0 days.

(21) Appl. No.: 09/887,761

(22) Filed: Jun. 22, 2001

(51) Int. Cl.[7] ............................................. B01D 53/04
(52) U.S. Cl. ........................ 95/23; 96/109; 96/116; 96/422
(58) Field of Search ......................... 95/1, 23; 96/109, 96/110, 115, 116, 117, 422; 55/342, 484

(56) References Cited

U.S. PATENT DOCUMENTS

| | | | |
|---|---|---|---|
| 4,561,865 A | * 12/1985 | McCombs et al. | .............. 95/130 |
| 4,857,086 A | * 8/1989 | Kawai | ........................... 96/111 |
| 5,238,469 A | * 8/1993 | Briesacher et al. | ........... 165/171 |
| RE34,434 E | * 11/1993 | Campbell et al. | .............. 96/110 |
| 5,334,237 A | * 8/1994 | Lorimer | ......................... 95/90 |
| 5,910,292 A | 6/1999 | Alvarez, Jr. et al. | |
| 6,059,859 A | 5/2000 | Alvarez, Jr. et al. | |
| 6,068,685 A | * 5/2000 | Lorimer et al. | ............... 96/112 |
| 6,168,645 B1 | * 1/2001 | Succi et al. | .................... 95/116 |

OTHER PUBLICATIONS

"Gas Purification SiGe Production" Reprinted from Solid State Technology Magazine, Jun. 2000.

* cited by examiner

*Primary Examiner*—David A. Simmons
*Assistant Examiner*—Frank M. Lawrence
(74) *Attorney, Agent, or Firm*—Brown, Martin, Haller & McClain, LLP

(57) ABSTRACT

A gas purification system has at least one purifier in a purifier line with a gas supply inlet at one end and a process outlet at an opposite end for connection to a process tool using the purified gas. A vent line having a vent outlet is connected to the outlet end of the purifier. A control valve in the vent line controls connection of the purifier outlet to the vent outlet, and a control valve in the purifier line controls connection of the purifier outlet to the process outlet. A flow controller in the purifier line controls flow rate through the purifier. The system is controlled to provide an increased flow rate through the purifier and to connect the purifier outlet to the vent outlet on start up of the system, and then to connect the purifier outlet to the process outlet as soon as conditioning is complete.

23 Claims, 4 Drawing Sheets

GAS PURIFICATION SYSTEM AND METHOD

BACKGROUND OF THE INVENTION

The present invention relates to a gas purification system and method for use in processes such as semiconductor manufacture which are highly sensitive to molecular contamination.

The performance and lifetime of semiconductors are reduced by molecular contaminants. Low temperature epitaxy (LTE) and other silicon processes utilize several gases and are particularly susceptible to impurity problems due to the low temperature. During epitaxial processing, impurities can migrate and become entrapped in the active layer at the device interface. Reliability problems such as low breakdown voltage and increased leakage current occur. These problems all increase as the growth process temperature is reduced.

Gas purifiers have been shown to improve the results achieved by low temperature epitaxial (LTE) processing. However, several drawbacks have restricted their application to only 100% non-blended gas applications. When purifiers are used on mixed gas blends, sometimes referred to as dopant gases, the gas mixture composition changes when initially run through the purifier. Several specialty gases (e.g. Silane, Germane, Diborane, Phosphine, Arsine) are used as mixtures with inert gases or hydrogen in a typical integrated circuit manufacturing process. This gives rise to problems when using purifiers to purify such gas mixtures, particularly if the dopant gas is at a very low percentage of the mixture. For example, when a 1% germane, 99% hydrogen gas blend is run through a purifier, initially all the germane will be removed. Gradually, the purifier will become saturated for germane and the 1% germane will flow through without absorption. However, in order for a purifier to achieve this level, several hours, days, or even weeks of operation may be required before the purifier is fully conditioned. Additionally, if the gas line is allowed to sit stagnant or is pumped down to a vacuum, the purifier must again be conditioned by flowing the gas mixture through the purifier for a significant time period, in order to re-saturate the purifier. Because of this conditioning and reconditioning period each time the process is re-started, purifiers have not, in the past, been applied to gas mixtures, even though such mixtures are known to contain contaminants that adversely affect the process.

SUMMARY OF THE INVENTION

It is an object of the present invention to provide a new and improved conditioning system and method for gas purification.

According to one aspect of the present invention, a gas purification system is provided, which comprises an inlet port for connection to a supply of gas to be purified, a process outlet port for connection to a process using the purified gas, a purifier line between the inlet port and the process outlet port, a gas purifier connected in the purifier line between the inlet port and the outlet port, the purifier having an inlet and an outlet, a vent line having a vent outlet port connected to the purifier outlet, a first outlet valve in the vent line for controlling connection of the purifier outlet to the vent outlet port, a second outlet valve in the purifier line for controlling connection of the purifier outlet to the process outlet port, and a mass flow controller in the line for controlling the amount of gas flowing through the purifier.

The system may include a by-pass line connecting the inlet port directly to the process outlet port, by-passing the purifier, an inlet valve in the first connecting line for controlling gas supply to the purifier, and a by pass valve in the by-pass line for controlling connection of the gas directly from the inlet to the process outlet port. A system controller is provided to control operation of the various valves and the mass flow controller between various modes of operation. When the system is not in operation, or in an idle mode, all valves will be closed. When the system is turned on, the purifier will first be connected to the vent outlet by opening the first outlet valve and closing the second outlet valve. At the same time, the mass flow controller is controlled to provide a high flow rate, so that the purifier is conditioned rapidly. Once the purifier is conditioned, the first outlet valve is closed and the second outlet valve is opened, supplying purified gas to the tool or process. The mass flow controller measures the total flow through the purifier during conditioning to determine when conditioning is complete, so that the purifier can immediately be placed back in-line with the outlet port to the process or tool.

In one embodiment of the invention, a gas purification system for gas mixtures is provided, in which several different gases are supplied to a tool in different proportions along separate supply lines, and each supply line is provided with an appropriate gas purifier, with at least some of the gas supply lines being provided with a mass flow controller and a vent outlet as well as a process outlet, with valves for controlling purifier outlet connection to the vent outlet or process outlet, and each gas supply line having a bypass line connecting the gas inlet directly to the process outlet, bypassing the purifier, with a bypass valve in the bypass line for controlling bypass of the purifier. A suitable controller is provided for controlling operation of the mass flow controllers and the various valves in each gas supply line, such that the gas flowing through each purifier is connected to vent until the purifier is conditioned, and is then automatically connected to the process outlet. The controller may be arranged such that unpurified gas is supplied to the process outlet via the by pass line during conditioning. Once the purifier is conditioned, the purifier outlet will again be connected to the process outlet, and the bypass valve will be closed.

The entire gas purification or manifold system for the various gases can be mounted in a single, compact housing with a suitable display unit for indicating process conditions. This makes it quick and easy to incorporate this system in an existing tool or process, simply by connecting the housing between the various gas supply inlets and the tool.

According to another aspect of the present invention, a gas purification method is provided which comprises the steps of:

connecting a gas purifier inlet to a gas supply;

connecting an outlet of the gas purifier to a vent outlet for a predetermined time period sufficient to condition the purifier; and closing the vent outlet and connecting the gas purifier outlet to a process inlet using the purified gas after the purifier is conditioned.

The gas supply may also be connected through a bypass line to the process inlet while the purifier is being conditioned, with a mass flow controller in line with the purifier controlling the amount of gas flowing through the purifier and the amount of unpurified gas supplied directly to the process inlet. Once the purifier is conditioned, a valve in the bypass line is closed, and the purifier outlet is connected to the process inlet. This arrangement avoids any tool or process downtime as the purifier is conditioned. Additionally, the mass flow controller and valves may be controlled in order to flow a small amount of gas through the purifier to the vent whenever the process or tool is inoperative, avoiding the need to re-condition the purifier after a process shut down, dependent on the duration of the shut down.

The gas purification system and method of this invention permits blends of gases to be conditioned without needing to purge the purifier through the tool, and also allows the purifier to be by-passed to feed the tool directly during purifier conditioning. The purifier can also be reconditioned immediately prior to placing the purifier back online to feed the tool after a shut-down. The mass flow controller allows the purifier to be conditioned much faster, by running a larger amount of gas through the purifier to the vent during conditioning, and then reducing the gas flow to process requirements after conditioning is complete. Also, the total flow through the purifier can be monitored in order to determine when conditioning is complete, and also to determine when a purifier is likely to have reached the end of its expected life.

BRIEF DESCRIPTION OF THE DRAWINGS

The present invention will be better understood from the following detailed description of an exemplary embodiment of the invention, taken in conjunction with the accompanying drawings in which like reference numerals refer to like parts and in which.

DETAILED DESCRIPTION OF THE DRAWINGS

Figure 1:
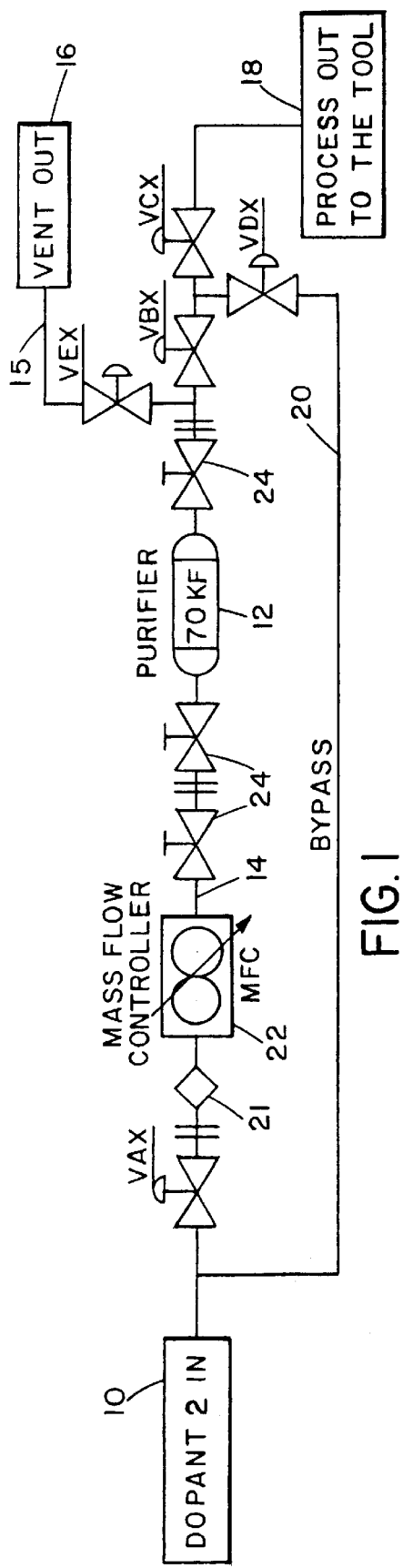
FIG. 1 is a block diagram of an individual gas purifier manifold according to a first embodiment of the invention.

FIG. 1 is a block diagram illustrating a gas purification manifold or system for a gas mixture such as a dopant gas mixture used in semiconductor manufacture. The system basically comprises an inlet port 10 for connection to a supply of the dopant gas mixture, a gas purifier 12 connected in purifier line 14 with the inlet port 10 and a process outlet 18 for connection to the tool which requires the dopant gas mixture. A vent line 15 is connected between the purifier outlet side of the line 14 and a vent outlet port 16. A bypass line 20 is connected between the inlet port 10 and process outlet 18. A filter 21 and a mass flow controller 22 are connected in line 14 between the inlet port 10 and process outlet 18.

Various valves are provided in the manifold for controlling connection of the purifier to the vent or process outlets, and for controlling bypass flow along the bypass line. Manual valves 24 are provided in the purifier line 14 to allow the purifier 12 to be removed for regeneration or replacement, as needed. A first valve VAX in the purifier line controls connection of the gas inlet port 10 to the purifier inlet, while second and third valves VBX and VCX control connection of the purifier outlet to the process outlet 18. A valve VDX in the bypass line controls connection of the bypass line between the gas inlet port 10 and process outlet 18. Finally, valve VEX in the vent line 15 controls connection of the purifier outlet to the vent outlet 16. Each of the valves VAX, VBX, VCX, VDX and VEX is suitably an air operated valve with a control inlet for connection to a controller or microprocessor for controlling switching of the valve between the open and closed conditions based on a predetermined program sequence, as will be explained in more detail below.

Figure 1A:
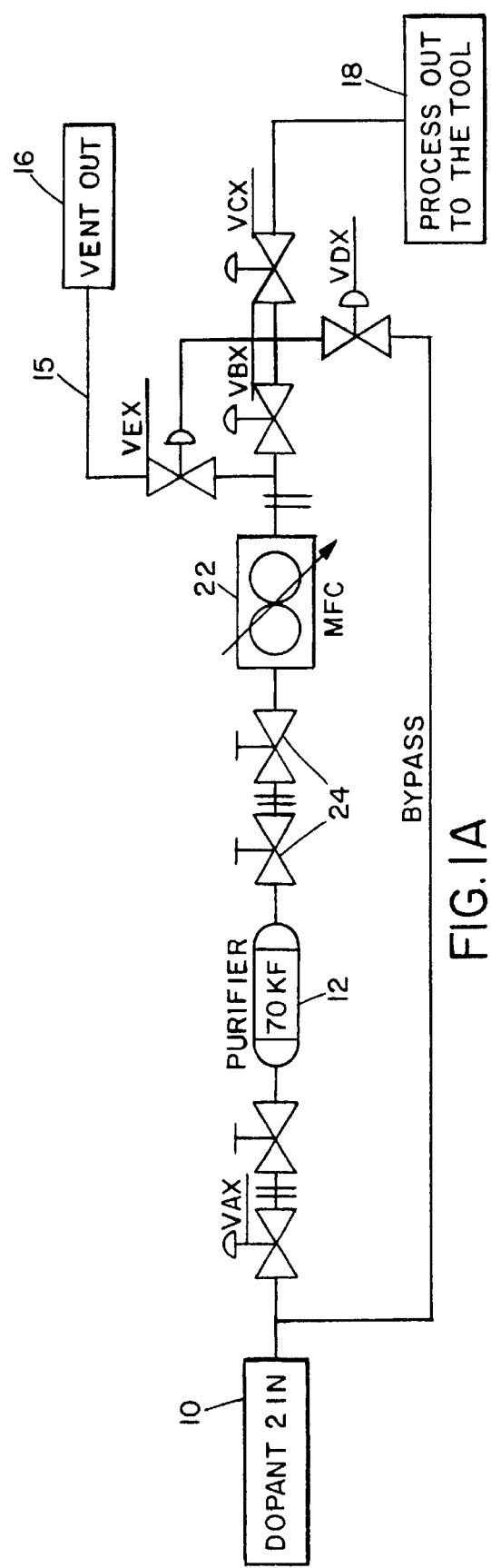
FIG. 1A is a block diagram similar to FIG. 1, illustrating a modification.

Although the mass flow controller is shown upstream of the purifier 12 in FIG. 1, it may alternatively be positioned downstream of the purifier, as illustrated in FIG. 1A. In that case, filter 21 will not be required since particulates which could damage the mass flow controller will be removed by purifier 12. In this alternative configuration, mass flow controller 22 will be located between the manually operated valve 24 to the right of the purifier 12, and the vent line 15.

The purifier 12 will be selected dependent on the gas or gas mixture to be purified. Aeronex, Inc. of San Diego, Calif. provides purifiers designed for purifying various different gases, such as the Aeronex Gatekeeper products. One such purifier for purification of hydride gas streams is described, for example, in U.S. Pat. No. 6,241,955 of Alvarez, Jr. Other purifiers for purification of other gas streams are also provided by Aeronex. The mass flow controller 22 may be any suitable thermal mass flow controller, such as those provided by Millipore Corporation of Texas, AERA Instruments of Japan and Texas, and UNIT Instruments of Yorba Linda, Calif.

Figure 2:
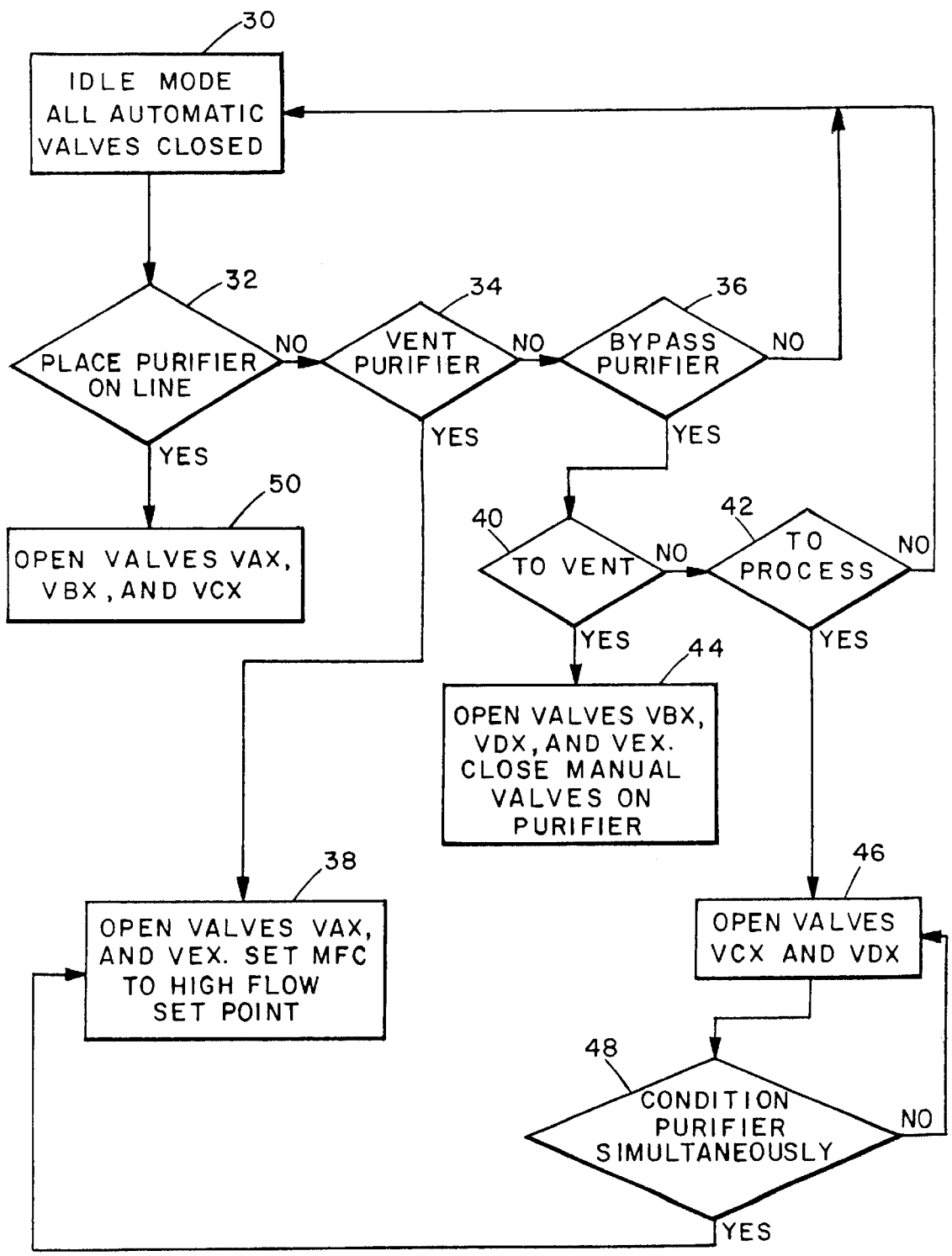
FIG. 2 is a flow diagram illustrating operation of the purifier manifold of FIG. 1.

A suitable controller or microprocessor is provided to control gas flow through the system of FIG. 1 according to the flow diagram illustrated in FIG. 2. In the IDLE mode 30, all of the automatic valves VAX to VEX will be closed. When the system is initially started up, it will first be determined whether or not the purifier is to be placed on line (32). The purifier must first be conditioned when initially put on line or re-conditioned after any shut down, so the purifier must first be connected to the vent (34) and/or bypassed (36). If the purifier is to be connected to vent, the valves VAX and VEX are opened (step 38) and the mass flow controller 22 is also set for a high flow rate. If the purifier is to be bypassed (36), the bypass line 20 may either be connected to the vent (40) or to the process outlet 18 (42). If the bypass line 20 is to be connected to the vent, valves VBX, VDX and VEX are opened, and the manual valves on the purifier must be closed (step 44). If the bypass line is to be connected to the process outlet 18, valves VCX and VDX will be opened (step 46). At the same time, a decision is made at step 48 either to condition the purifier simultaneously, or not. If the purifier is to be conditioned while unpurified gas is bypassed directly to the process outlet, valves VAX and VEX are opened (38) and the mass flow controller is suitably controlled in order to provide a high flow rate through the purifier.

Once the mass flow controller output indicates that a sufficient amount of gas has passed through the purifier in order to condition the purifier medium such that the same percentage of each component of a gas mixture will be present at the purifier output as is input at the purifier input, the valves VAX, VBX and VCX will be opened (50) while the bypass valve VDX and vent valve VEX remain closed. Thus, gas will flow through the purifier to the process or tool outlet 18. This arrangement considerably reduces or even eliminates tool down time while a purifier is being conditioned for a mixture of gases. If the process or tool is to be shut down for a period of time, the system may return to the idle mode 30 or a small amount of gas may be run through the purifier to the vent, such that the purifier remains conditioned and ready for immediate start up when the tool goes on line again. The mass flow controller is set to a low flow set point with valves VAX and VEX opened while the tool is shut down. This may not be practical where the tool or process is off for a significant length of time, such as overnight or a weekend, and in this case the system will simply remain in IDLE mode, and the purifier will be vented when the tool is first started up, with a high flow through the purifier, for a sufficient time period to re-condition the purifier.

Figure 3:
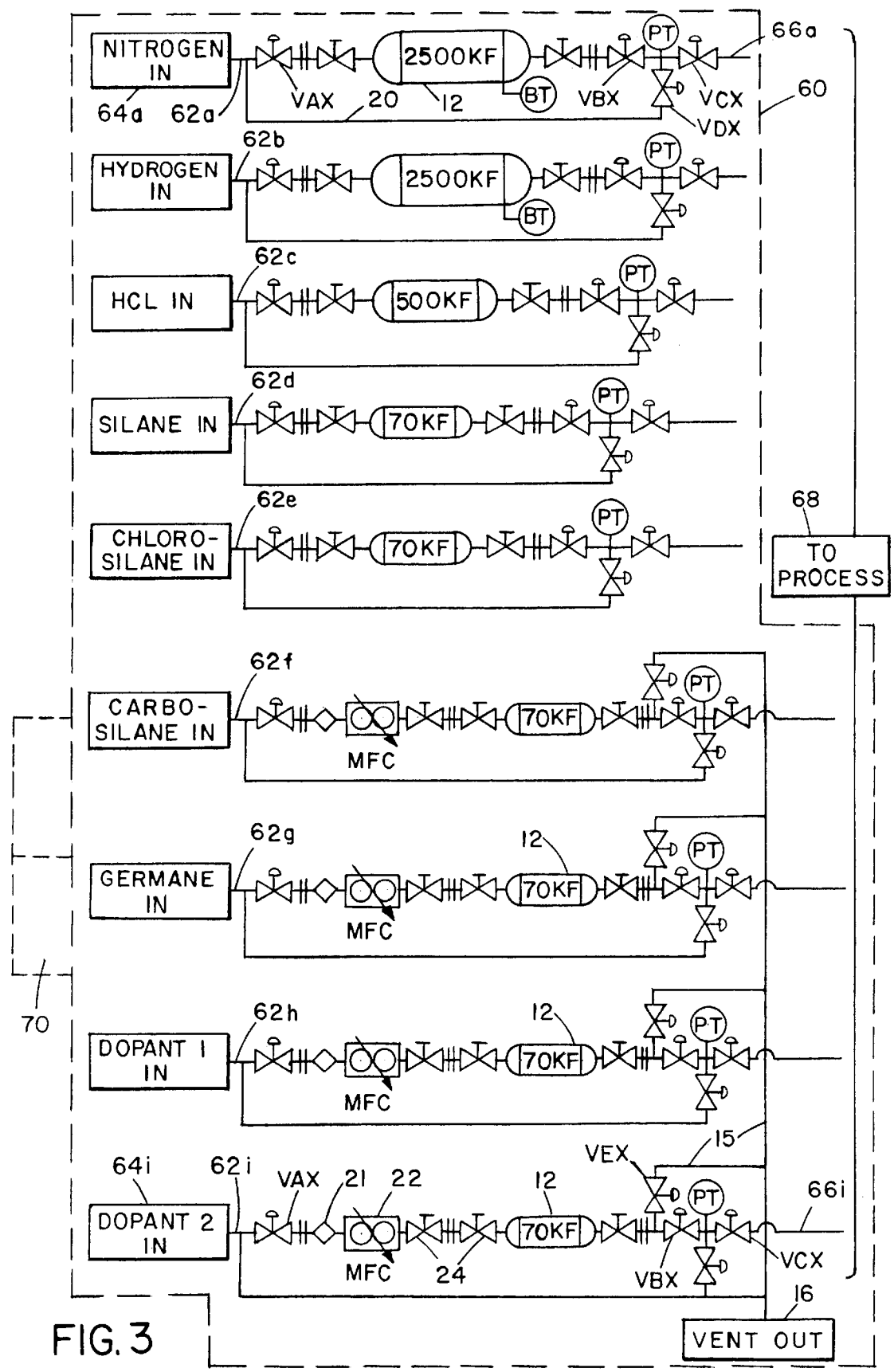
FIG. 3 is a block diagram of a gas purifier system for several gases and gas fluids according to another embodiment of the invention.
Figure 4:
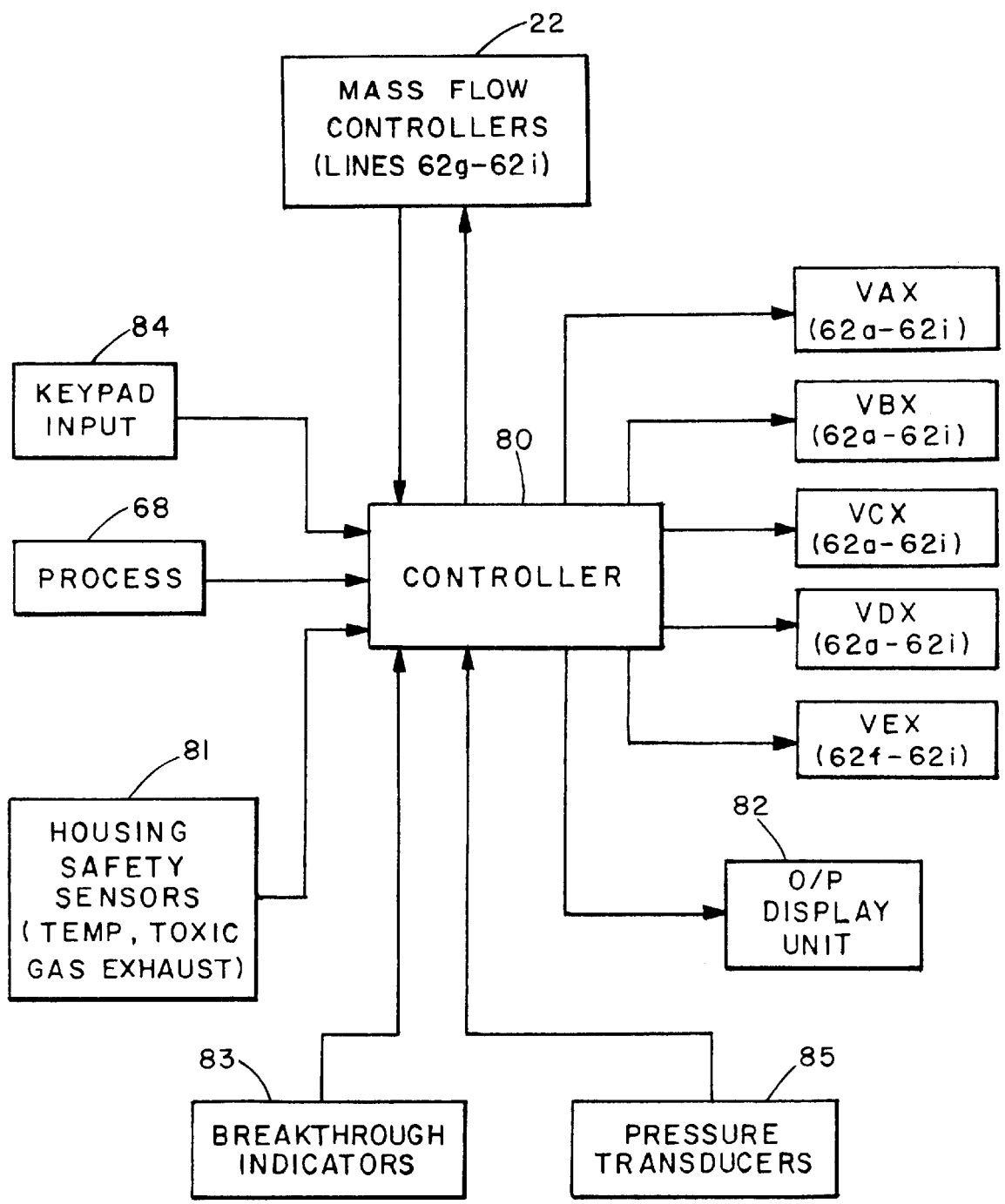
FIG. 4 is a block diagram of the controller for the system of FIG. 3.

FIGS. 1 and 2 illustrate a purifier conditioning manifold system for a single gas mixture. FIGS. 3 and 4 illustrate a gas purification system and method for a plurality of different gases and gas mixtures as is typically used in semiconductor manufacturing processes such as low temperature epitaxial processing. As illustrated in FIG. 3, a single purifier cabinet or housing 60 contains a manifold assembly including a plurality of separate gas lines, one for each of the different gases and gas mixtures to be purified. In the illustrated embodiment, there are nine separate gas lines 62a–62i each connected to a separate gas inlet port 64a–64i at one side of the housing and to a separate gas outlet port 66a–66i on another side of the housing. The gas inlet ports are connected to suitable supplies of the various gases, while the outlet ports are connected at the appropriate points in the process or tool 68. The purifier housing is designed to be positioned as close as possible to the tool or process, in order to minimize outgassing effects downstream of the purified gas. An exhaust duct 70 for gases vented in the housing is provided on the housing, and is suitably plumbed to a flammable exhaust system.

It will be understood that the number of separate gas lines will be dependent on the process or tool requirements, and a greater or lesser number may be provided in other embodiments. In the illustrated embodiment, line 62a is for nitrogen, line 62b is for hydrogen, line 62c is for silane, line 62d is for a chlorosilane source, line 62e is for a carbosilane 10% (balance hydrogen), line 62f is for HCL, line 62g is for germane, line 62h is for a first dopant such as diborane, arsine, or phosphine, and line 62i is for a second dopant such as diborane, arsine, or phosphine.

Each gas line has a suitable purifier 12 for removing typical contaminants from the gas or gas mixture, and manual valves 24 on each side of the purifier for allowing it to be removed when replacement or regeneration is necessary. The choice and size of purifier in each line is dependent on the type of contaminants in the gas being purified and the gas flow rate required, as will be understood by those skilled in the field. As noted above, suitable Aeronex Gatekeeper products may be selected for each gas or gas blend. These products remove contaminants from process gases to sub-ppb levels. Contaminants are removed by chemisorption, oxidation, and adsorption. If necessary, the purifiers may include palladium cells for the hydrogen purifier line and/or getter technology for the nitrogen purifier line.

Air operated valves VAX, VBX and VCX are provided in each line 62 between the inlet port and the outlet port. A bypass line 20 connects each gas inlet port 64 directly to the gas outlet port 66, bypassing the purifier 12, and an air operated valve VDX is provided in the bypass line 20. Each of the purifier lines used with a gas mixture of 10% or less, in this case the last four lines 62f to 62i, also have a filter 21 and a mass flow controller 22 in line with the purifier 12, and a vent line 15 connecting the purifier outlet to a vent outlet 16, as in the embodiment of FIG. 1. A single vent outlet 16 is connected to all of the vent lines 15, as indicated in FIG. 3.

A controller or microprocessor 80 will be connected to the various mass flow controllers 22 in each purifier line 62f to 62i, and to each of the air operated valves in the purifier, bypass and vent lines, as indicated in FIG. 4. The controller will be programmed to control connection of each purifier line or bypass line to the process outlet, to control connection of the purifiers in lines 62g to 62i to the vent outlet, and to control the flow set point of each of the mass flow controllers 22, according to the flow diagram generally illustrated in FIG. 2. Additionally, various safety sensors or monitors 81 will be provided in the housing and linked to the controller for safety purposes. One sensor will monitor the exhaust output and an alarm condition will be activated on any loss in exhaust. Other sensors will provide signals to the controller on detection of any toxic gas leak in the housing, which will also initiate an alarm or EMO condition. At least some of the purifiers will include conventional breakthrough indicators (BT) 83 linked to the controller, and pressure transducers (PT) 85 may also be provided in the purifier lines to monitor pipelines for clogging, as also indicated at BT and PT in FIG. 3. The controller will also be linked to the process or tool controller and requires a go/no-go signal from the tool to enable operation of process gas flow by opening the outlet valves VCX. A front panel on the housing will include a display unit 82 for indicating any alarm conditions. A keypad 84 is provided for operator input to the controller. The parameters which may be configured are the operating temperature, mass flow controller flow rates, conditioning time, conditioning sequence, alarm set points for breakthrough indicators and total flow, and default start up conditions.

There are six basic modes of operation for each purifier line which has a vent line and mass flow controller. These are:

1. Idle mode—The purifier is powered up while all controller operated valves are closed (see block 30 of FIG. 2).
2. Purifier on line—The purifier is placed on line with its output connected to the tool or process. This requires a tool ready signal from the process or tool.
3. Purifier on bypass—The purifier is bypassed and gas is supplied directly to the tool, without purification. This also requires a tool ready signal from the tool.
4. Condition purifier to vent—This mode allows gas to flow through the purifier to the vent while the purifier is conditioned. The gas flow rate is controlled by the mass flow controller.
5. Condition purifier and simultaneously feed tool—This mode is the same as mode 4, but also allows unpurified gas to bypass the purifier and flow to the tool. The gas flow rate to the purifier and tool is controlled by the mass flow controller. This mode also requires a tool ready signal from the tool.
6. Purifier purge—This mode allows for purging both ends of the purifier during removal and installation.

The keypad is used to initially start the system and to return the system from a power off or EMO (alarm) condition. The system determines the process step or mode it was last performing before a power off condition, and resumes that process step or mode upon restart, if it is possible to do so. Otherwise, the process begins at the most recent viable step to resume operation. A keypad switch may also be used to clear system alarms. The keypad is also used to set the state of each purifier and to set the flowrates of the mass flow controllers.

In the event of a major alarm condition, the process gas flow will be interrupted by closing all process valves VAX to VEX and removing input power from the system. A major alarm condition is also signaled on the display or LED panel, and may be signaled to a remote control room via a remote interface. The following conditions will initiate a major alarm indication:

1. Loss of exhaust gas flow.
2. Detection of undesired gas such as a toxic, corrosive, or flammable gas in the housing.
3. EMO—this can be generated internally or externally.
4. Detection of fire.

In addition to the major alarms, the controller is programmed to monitor for various minor alarm conditions. These conditions do not interrupt gas flow, but simply provide an indication on the display panel and over any remote interface to the system. The minor alarm conditions are:

1. Over temperature, which occurs when the purifier temperature exceeds a preset value, which is an operator configurable parameter.
2. Under temperature, which occurs when the purifier temperature is less than a preset value. Again, the lower temperature limit is an operator configurable parameter.
3. Flow, which occurs when a mass flow controller does not reach a desired setpoint. This is also a configurable parameter.
4. Power supply failure.
5. Nitrogen or hydrogen purifier exceeds end of life setpoint. This is a configurable parameter.
6. Any purifier exceeds totalized lifespan. This is a configurable parameter.
7. Purifier fails to complete conditioning period. This is a configurable parameter.

The gas purification system and method of this invention allows conditioning of purifiers for blends of gases without having to purge through the tool to which the gas blends are to be supplied, by providing a vent outlet from the purifier. Additionally, the purifier can be bypassed during conditioning to feed unpurified gas to the process tool, eliminating or reducing tool down time. The mass flow controllers in each purifier line having a vent outlet allow a larger gas flow during conditioning to the vent outlet, so that the purifier can be conditioned much faster for low percentage gases in the blend. The mass flow controllers also allow the total flow to be measured to determine when conditioning is complete, and also to determine when a purifier is reaching the end of its expected life.

The single housing gas purification system of this invention allows for purification of all needed gases at the point of use of the tool. The purifier can be easily installed on site, without requiring the end user to be a purifier expert. All purification and all associated equipment is located in a single housing under a single controller, reducing expense, time and difficulty in installation. The system is designed for single and multi-chamber epitaxy tools with up to three chambers per tool.

Process gas variability is a key factor affecting film performance in the semiconductor field. The purification system of this invention will reduce variability in process gases used to fabricate the silicon films. By purifying all process gases at the point of use, such variables can be substantially eliminated.

Although an exemplary embodiment of the invention has been described above by way of example only, it will be understood by those skilled in the field that modifications may be made to the disclosed embodiment without departing from the scope of the invention, which is defined by the appended claims.

We claim:

1. A gas purification method, comprising the steps of:
    connecting a gas purifier inlet to a supply of gas which is to be purified of contaminants;
    passing said gas through said purifier while connecting an outlet of the gas purifier to a vent outlet for a predetermined time period sufficient to condition the purifier;
    varying the gas flow rate through the gas purifier dependent on whether the purifier is connected to the vent outlet or process inlet by connecting a mass flow controller in line with the purifier and controlling the mass flow controller to supply gas at a higher flow rate while the purifier outlet is connected to the vent outlet and reducing the gas flow rate when the purifier outlet is connected to the process inlet; and
    closing the vent outlet and connecting the gas purifier outlet to a process inlet using the purified gas after the purifier is conditioned;
    whereby said gas is purified of said contaminants without significant deterioration in activity of said gas.

2. The method as claimed in claim 1, including the step of connecting the purifier outlet to the vent and controlling the mass flow controller to flow a small amount of gas through the purifier to the vent outlet when the process is shut down.

3. The method as claimed in claim 1, including the steps of monitoring the gas flow through the mass flow controller during conditioning, determining when the total amount of gas which has flown through the purifier is sufficient to condition the purifier, and closing the vent outlet and opening the process inlet when it is determined that conditioning is complete.

4. The method as claimed in claim 3, including the step of monitoring the total gas flow through the mass flow controller, determining when the total gas flow is equivalent to a predicted purifier lifetime, and providing a warning indication on an output display device when the predicted purifier lifetime is reached.

5. A gas purification system, comprising:
    a purifier line having a gas inlet at one end for connection to a supply of a gas mixture comprising a carrier gas and an inorganic dopant gas which is to be purified of contaminants and a process outlet at an opposite end for connection to a process tool using the purified gas mixture;
    a purifier for purifying the gas mixture connected in the purifier line between the inlet and the outlet, the purifier having an inlet end and an outlet end;
    a vent line connected to the outlet end of the purifier and having a vent outlet;
    a vent control valve in the vent line for controlling connection of the purifier outlet to the vent outlet; and
    a process outlet valve in the purifier line for controlling connection of the purifier outlet to the process outlet;
    whereby said gas mixture is purified of said contaminants without significant deterioration in the concentration of said dopant gas in said mixture.

6. The system as claimed in claim 5, including a mass flow controller in the purifier line for controlling the amount of gas flowing through the purifier.

7. The system as claimed in claim 6, wherein the mass flow controller is upstream of the purifier.

8. The system as claimed in claim 6, wherein the mass flow controller is downstream of the purifier.

9. The system as claimed in claim 5, including a by pass line connecting the gas inlet directly to the process outlet and bypassing the purifier, and a bypass valve in the bypass line for controlling bypass of the purifier.

10. The system as claimed in claim 5, including a system controller for controlling operation of the control valves to vent the purifier or connect the purifier outlet to the process outlet, the controller being programmed to connect the purifier to the vent for a predetermined time period sufficient to condition the purifier, and subsequently to connect the purifier outlet to the process outlet.

11. The system as claimed in claim 10, including a mass flow controller in the purifier line for controlling the gas flow rate through the purifier, the system controller being programmed to increase the gas flow rate when the purifier is connected to the vent outlet and decrease the gas flow rate when the purifier is connected to the process outlet.

12. A gas purification system, comprising:
a plurality of purifier lines, each having a gas inlet at one end for connection to a supply of one gas mixture of a plurality of different gas mixtures, each gas mixture comprising a carrier gas and a dopant gas, said one gas mixture to be purified of contaminants, and a process outlet at an opposite end for connection to a process tool using the purified gas mixture;
a predetermined purifier in each purifier line for removing contaminants from the gas mixture in said line, at least one of said plurality of purifier lines having a vent line connecting the purifier outlet in said line to a vent outlet in said vent line;
a vent control valve in the vent line for controlling connection of the purifier outlet to the vent outlet; and
a process outlet valve in the purifier line for controlling connection of the purifier to process outlet;
whereby each said gas mixture is purified of said contaminants without significant deterioration in concentration of said dopant gas in said mixture.

13. The system as claim in claim 12, wherein each purifier line for removing contaminants from a gas mixture containing less than a predetermined concentration of said dopant comprises a controllable output purifier line connected to a vent line.

14. The system as claimed in claim 13, wherein each controllable output purifier line is connected to a gas mixture supply wherein said dopant gas is present in said mixture in a concentration in the range of 50 ppm to 10% of said mixture.

15. The system as claimed in claim 14, wherein said dopant gas is selected from the group consisting of silane, germane, diborane, phosphine and arsine.

16. The system as claimed in claim 15, wherein said dopant gas is selected from the group consisting of silane, germane and diborane.

17. The system as claimed in claim 12, wherein at least some of the purifier lines have no vent lines.

18. The system as claimed in claim 12, wherein all of the purifier lines are enclosed in a single housing.

19. The system as claimed in claim 14, including a single system controller for controlling connection of each controllable output purifier line to the vent outlet or the process outlet.

20. A gas purification system for supplying several different purified gases to a tool, comprising:
a plurality of separate purifier lines each having an inlet for connection to a predetermined gas supply and an outlet for connection to a process tool;
a predetermined purifier connected in each purifier line for purifying the gas supplied along the purifier line;
at least some of the purifier lines having a vent line connected to the purifier outlet;
a vent outlet connected to each vent line for venting gas from the respective purifier;
a vent control valve in each vent line for controlling purifier outlet connection to the vent outlet;
a process outlet control valve in each purifier line for controlling purifier outlet connection to the process outlet; and
a system controller for controlling operation of the vent control valves and process outlet control valves, whereby each purifier connected to a vent line is connected to the vent outlet for a predetermined time period on start up of the system sufficient for the purifier to be conditioned, and the purifier is connected to the process outlet when conditioning is complete.

21. The system as claimed in claim 20, including an outer housing, all purifier and vent lines being mounted in the outer housing, the housing having a plurality of gas supply ports connected to the respective purifier line inlets, an exhaust port connected to each vent line, and a plurality of process outlet ports connected to the respective purifier process outlets.

22. The system as claimed in claim 20, wherein each purifier line has a bypass line connecting the gas inlet directly to the process outlet, bypassing the purifier, and a bypass valve in the bypass line for controlling bypass of the purifier, the system controller controlling operation of the bypass valve to supply gas directly to the process outlet during conditioning of the purifier.

23. The system as claimed in claim 20, including a mass flow controller in each purifier line having a vent line, the mass flow controller comprising means for controlling gas flow rate through the purifier, the system controller including means for controlling each mass flow controller to supply gas at a higher flow rate when the purifier is connected to the vent outlet than when it is connected to the process outlet.

* * * * *

UNITED STATES PATENT AND TRADEMARK OFFICE
CERTIFICATE OF CORRECTION

PATENT NO. : 6,514,313 B1
DATED : February 4, 2003
INVENTOR(S) : Spiegelman, Jeffrey J. et al.

It is certified that error appears in the above-identified patent and that said Letters Patent is hereby corrected as shown below:

<u>Column 10,</u>
Line 3, change "14" to -- 13 --

Signed and Sealed this

Twenty-fourth Day of June, 2003

JAMES E. ROGAN
*Director of the United States Patent and Trademark Office*